United States Patent
Iafrate et al.

(10) Patent No.: US 6,263,464 B1
(45) Date of Patent: Jul. 17, 2001

(54) DEVICE FOR CONTROLLING CONFORMITY OF CONSUMPTION OF AN ELECTRONIC COMPONENT IN A TESTING MACHINE

(75) Inventors: Gilles Iafrate, Chaponost; Jean-Pascal Mallet, Saint Priest en Jarez; Roland Petit, Saint Etienne, all of (FR)

(73) Assignee: Schlumberger Systemes, Montrouge (FR)

( * ) Notice: Subject to any disclaimer, the term of this patent is extended or adjusted under 35 U.S.C. 154(b) by 0 days.

(21) Appl. No.: 09/284,939

(22) PCT Filed: Nov. 6, 1997

(86) PCT No.: PCT/FR97/01987

§ 371 Date: Apr. 22, 1999

§ 102(e) Date: Apr. 22, 1999

(87) PCT Pub. No.: WO98/24026

PCT Pub. Date: Jun. 4, 1998

(30) Foreign Application Priority Data

Nov. 25, 1996 (FR) .................................................. 96 14510

(51) Int. Cl.⁷ ............................. G01R 31/28; G06F 11/00
(52) U.S. Cl. ........................................... 714/724; 324/765
(58) Field of Search .................................. 324/765, 763, 324/771, 753, 522, 759, 713, 691, 115, 158.1; 702/119; 714/736, 719, 740, 745

(56) References Cited

U.S. PATENT DOCUMENTS

| | | | |
|---|---|---|---|
| 5,375,075 | 12/1994 | Ogata et al. | 702/119 |
| 5,519,335 | 5/1996 | Thomas | 324/765 |
| 5,528,603 | 6/1996 | Canella et al. | 714/736 |
| 5,543,728 | 8/1996 | Grace et al. | 324/763 |

Primary Examiner—Albert Decady
Assistant Examiner—Guy Lamarre
(74) Attorney, Agent, or Firm—Frishauf, Holtz, Goodman, Langer & Chick, P.C.

(57) ABSTRACT

Conformance testing apparatus for testing the consumption of an electronic component in a testing machine. The apparatus includes a power supply circuit having current-measuring circuitry for measuring the current taken, a test sequencer, and a measurement sequencer in which each row contains a measurement flag representative of a command to perform or not to perform a current measurement. The measurement sequencer includes a multiple acquisition memory in which each acquisition row corresponds to a row of the measurement sequence whose measurement flag is positive. The memory includes, for each acquisition row, at least one limit value zone in which a limit value for the current is written, and at least one conformance zone in which a conformance flag is written representative of the result of a comparison between the current as measured and the limit value.

8 Claims, 3 Drawing Sheets

US 6,263,464 B1

DEVICE FOR CONTROLLING CONFORMITY OF CONSUMPTION OF AN ELECTRONIC COMPONENT IN A TESTING MACHINE

FIELD OF THE INVENTION

The present invention relates to conformance testing apparatus for testing electronic component consumption in a testing machine.

The invention is particularly advantageously applicable to the field of characterization or production testing of combined (analog/digital) very large scale integration (VLSI) CMOS components, and more particularly components operating under high current conditions such as microcontrollers or microprocessors.

BACKGROUND OF THE INVENTION

Generally, a machine for testing electronic components is essentially made up of three elements:

A computer which is the workstation enabling an operator to use suitable software for preparing the tests to be performed on the electronic components, e.g. components coming off a production line, so as to check that they operate properly. The test program is organized in a succession of test rows which must be executed in application of a given sequence, each test row indicating the logic signals or test signals to be applied simultaneously to certain pins of the components.

An electronic rack connected to the computer via a central processing unit, which rack includes a certain number of members serving firstly, such as a test sequencer, to generate said logic signals in application of the test sequence prepared by the operator, and secondly to compare the logic signals delivered at other pins by the components, in response to the test signals, with predefined responses to be expected if the components operate properly.

A work head in which the electronic components to be tested are disposed, the work head being provided with an electronic pin serving to put into analog form the test logic signals received from the electronic rack, depending on the technology and on the logic used by the components, and, conversely, to put into logic form the analog responses from the components prior to transmitting them to the rack for comparison purposes.

Furthermore, the electronic rack includes a DC power supply subassembly serving to apply to the components under test the bias voltages that are necessary for them to operate. This subassembly includes as many electrical power supply circuits per component as is necessary to power the component. Depending on the type of component to be tested, there exist various electrical power supplies which differ in that they have different maximum values for the bias current taken: cards are known having current values that are very low (up to 0.5 A), low (up to 4 A), high (up to 30 A), etc.

The various circuits of the power supply subassembly not only serve to power the components under test, they also serve to deliver a measurement of the current taken by each component. It is very important for a manufacturers to be able to subject the electronic components manufactured by them to consumption conformance testing, in particular since currents taken tend to become increasingly high. For this purpose, the electrical power supply circuits of testing machines are equipped with current-measuring means in known manner.

The command to perform current measurement may come from the central processing unit itself at moments in the test sequence that are defined initially by the operator at the same time as the test program is being prepared. It is also possible for the command to come from a current measurement sequence have a succession of measurement rows, each of which corresponds to a test row of the test sequence, and contains a measurement flag representative of a command to perform or not to perform a current measurement. Said measurement sequence constitutes a kind of supplement to the test sequence. Naturally, the measurement sequence flags are predefined by the operator, prior to execution of the tests proper.

Currently, the value of the current as measured, in application of a command coming either from the central processing unit of the electronic rack, or from the pre-established measurement sequence, is compared with at least one reference value by said central processing unit itself. That suffers from a certain number of drawbacks. Firstly, the running of the test sequence is interrupted each time the current is measured, in order to be informed of the result of the comparison so as to decide whether to stop the tests or to continue them. If the specified number of current measurements is large, a considerable amount of time is wasted during the tests. Furthermore, after each interruption in the test sequence for the purpose of measuring the current, the test sequence starts again from the beginning for reasons of initialization, which lengthens the test time even further. Unfortunately, today, test time is an increasingly large factor in the cost of electronic components.

SUMMARY OF THE INVENTION

Therefore, the technical problem to be solved by the present invention is to provide conformance testing apparatus for testing the consumption of an electronic component in a testing machine, the apparatus including:

at least one electrical power supply circuit for powering the component, which circuit includes current-measuring means for measuring the current taken by said electronic component;

a test sequencer suitable for executing a sequence of test rows to be applied to the component; and a current measurement sequencer suitable for executing a sequence of measurement rows, each of which corresponds to a test row, and contains a measurement flag defined prior to execution of the test sequence and representative of a command to perform or not to perform a current measurement;

such an apparatus making it possible to avoid wasting time when running tests, such time wasting being induced in currently used testing machines by measuring the current taken and by comparing the results obtained with one or more reference values.

According to the invention, the solution to the technical problem posed consists in that said measurement sequencer includes a multiple acquisition memory having a plurality of acquisition rows, each of which corresponds to a measurement row of the measurement sequence whose measurement flag is positive, said memory including for each acquisition row:

at least one limit value zone in which a limit value for the current taken by the electronic component is written prior to execution of the test sequence; and at least one conformance zone in which, for each measurement, a conformance flag is written representative of the result of a comparison performed in a register associated with said memory between the current as measured and said limit value.

Thus, in the apparatus of the invention the comparison between the current as measured and the limit value is no longer performed by the central processing unit, but rather it is performed in the multiple acquisition memory, in a register provided for this purpose, the result of the comparison, i.e. said conformance flag, being written in the memory measurement after measurement, without there being any interruption in the test sequence, and therefore without the sequence starting again from the beginning after each measurement. Once the series of tests is finished, the operator can, by reading back row-by-row the conformance zones, either note that all of the current measurements conform to expectations, or identify that moment in the test sequence at which an anomaly in the consumption of the component occurred, thereby possibly enabling the operator to determine the cause of the anomaly or to evaluate the importance thereof.

When it is merely necessary for the operator to have access to the overall result of the measurements of the current consumption of the component under test, the invention provides that said multiple acquisition memory further includes a global status row including a global conformance zone corresponding to said conformance zone, and in which a global conformance flag is written after the test sequence has been executed, the global conformance flag being positive if all of the conformance flags are positive, or negative if at least one conformance flag is negative.

In a particular embodiment of the invention, for each acquisition row, said multiple acquisition memory includes a measurement zone in which the value of the current as measured is written for each measurement. In this way, the operator knows the consumption of the component under test point-by-point, thereby making it possible to characterize the component fully.

In existing testing machines, the electrical power supply circuits generally offer a plurality of (usually two) possible measurement ranges, depending on the precision required for the current measurement. While preparing the sequence of tests and the sequence of measurements for measuring the current taken, the operator preselects a single range in which all of the current measurements are to be performed, without any possibility of the selected range being changed while the sequence of measurements is in progress.

To remedy that drawback, the invention provides that, with said means of measuring the current taken by the component being suitable for delivering a current value in a plurality of measurement ranges, the multiple acquisition memory includes a range zone for each acquisition row, in which zone a range flag indicating the selected measurement range is written prior to execution of the test sequence.

This additional flexibility makes it possible to choose the most suitable measurement range a priori, as a function of each test to be performed. It is known that electronic components such as microcontrollers and microprocessors have consumption that varies significantly as a function of their operating mode. For example, in the work mode, the consumption of the component is high, and a high measurement range is thus chosen, whereas, in standby mode, the consumption is lower, and so a low measurement range is then more suitable.

BRIEF DESCRIPTION OF THE DRAWINGS

The invention and how it may be implemented will be well understood from the following description given with reference to the accompanying drawings which are given by way of non-limiting example, and in which.

DETAILED DESCRIPTION OF THE PREFERRED EMBODIMENTS

Figure 1:
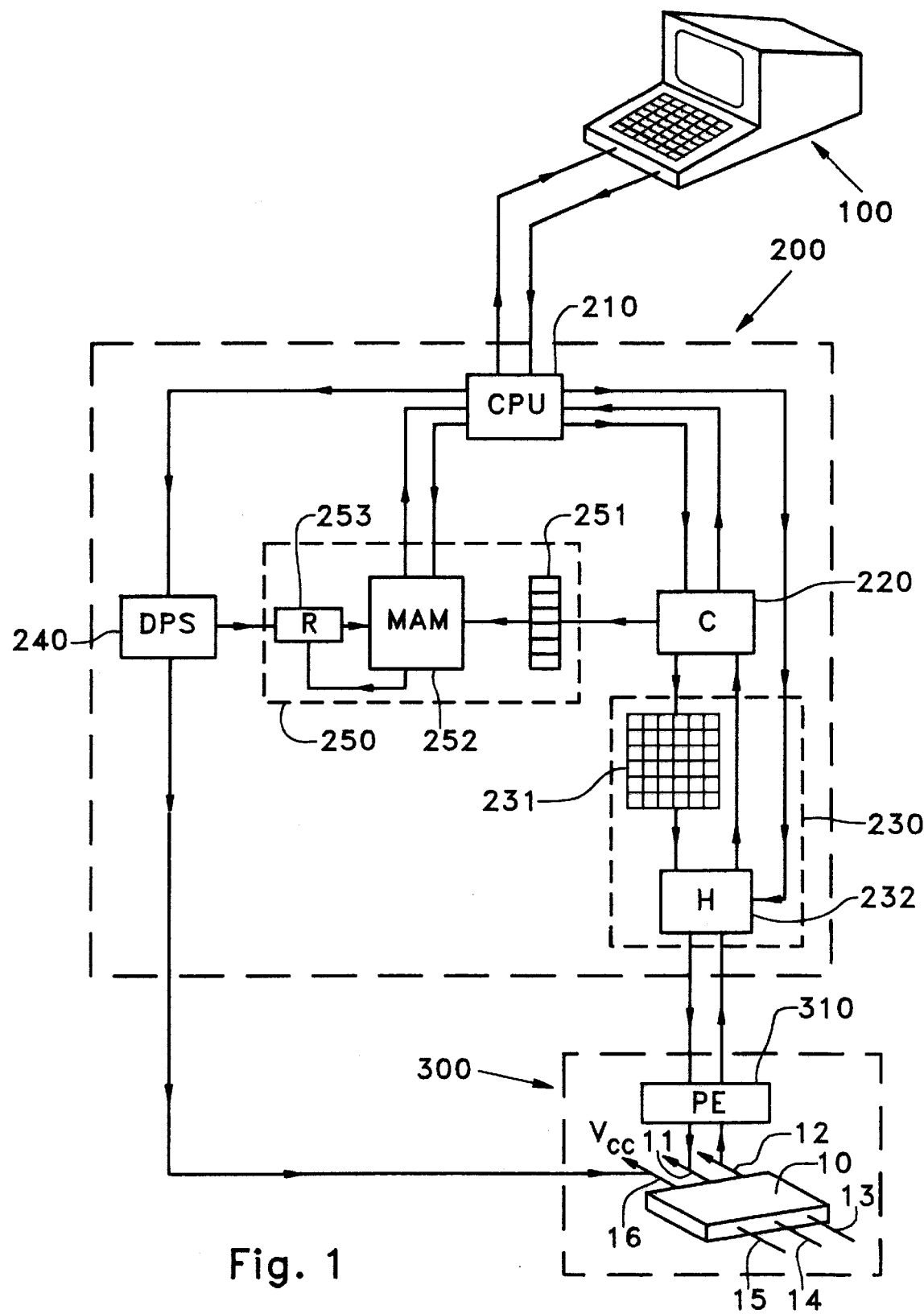
FIG. 1 is an overall diagram of a testing machine including conformance testing apparatus of the invention for testing consumption.

FIG. 1 diagrammatically shows a testing machine for testing an electronic component 10 provided with pins numbered 11 to 16, for example. Some of the pins, such as pin 11, serve to receive analog test signals or stimuli coming form an electronic pin (PE) 310 situated in the work head 300 on which the component 10 under test is placed.

The signals delivered by said electronic pin 310 to pin 11, for example, are constituted by analog translations of logic signals (0 or 1) coming from the electronic rack 200 of the testing machine, and being dependent on the technology and on the logic of the component (TTL, ECL, etc.). Thus, a logic 1 can be translated by a voltage of +5 V in certain cases and by a voltage of +3 V in other cases.

The logic signals are generated in the electronic rack 200 by a test sequencer 230 comprising a circuit 232, known as an "H wiring panel", assigned to executing a test sequence 231 supplied by a testing circuit 220, known as a "C wiring panel". The structure of said test sequence 231 is shown more precisely in FIG. 2. It is constituted by a succession P of test rows, each test row defining a configuration for the logic signals which are to be applied simultaneously to N pins of the electronic component. The electronic component 10 responds to each of these test configurations by delivering analog response signals on certain pins, such as pin 12 in FIG. 1, which response signals are in turn put back into logic form by the electronic pin 310 prior to being compared in the circuit 232 with the logic responses expected for normal operation of the electronic component 10. The results of these comparisons are transmitted to the testing circuit 220 which, when the component fails the tests, takes the decision to stop the test sequence and to reject the component, or else to continue the sequence through to its end.

The test sequence 231 is compiled by an operator by means of specialized software, such as the ASAP (registered trademark) software, stored in the computer 100 of the testing machine. The function of the central processing unit 210 is to manage the various subassemblies of the electronic rack 200 as a function of instructions issued by the computer 100, and, conversely to feed information received from the electronic rack back to the computer.

The electronic component 10 is fed with DC, e.g. on pin 16, by a power supply subassembly comprising at least one power supply circuit (DPS) 240 suitable for applying a bias voltage Vcc to pin 16 of the component. There exist various types of power supply circuit depending on the current taken: PCDPS up to 0.5 A, LCDPS up to 4 A, HCDPS up to 30 A, VHCPDS thereabove.

Figure 4:
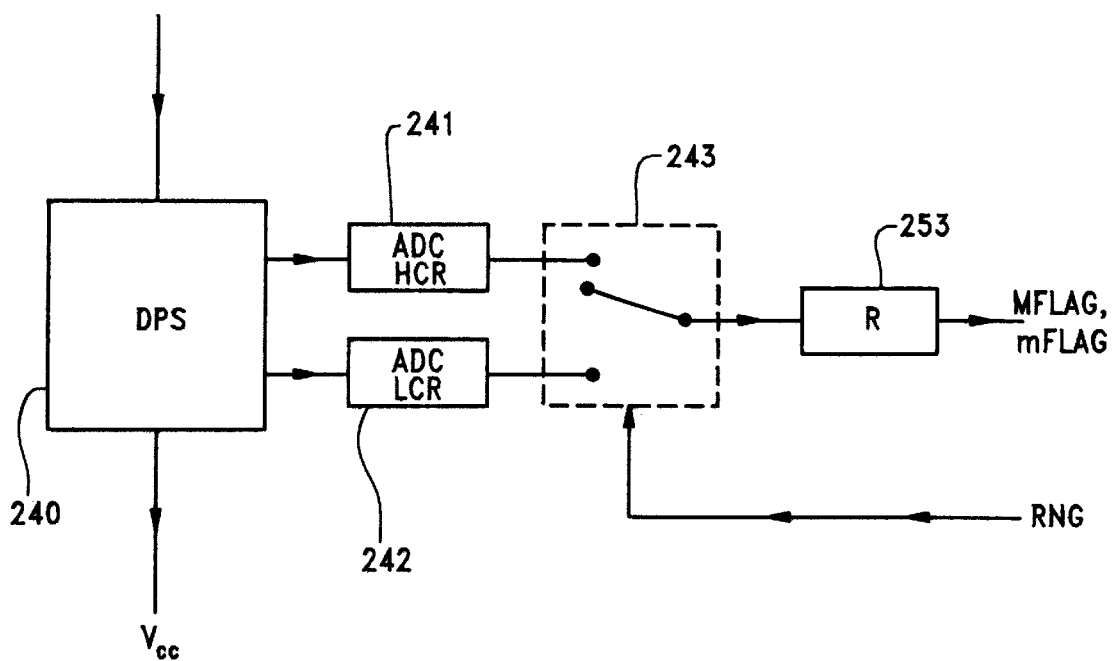
FIG. 4 is a diagram showing how the measurement range is changed.

In known manner, the power supply circuit 240 includes current-measuring means for measuring the current taken by the electronic component 10. As shown in FIG. 4, the DPS circuit 240 can deliver the value of the current as measured in two measurement ranges, namely a high range HCR to a first analog-to-digital converter 241, and a low range LCR to a second analog-to-digital converter 242.

The advantage of said current-measuring means lies in the fact that, in addition to testing the logic operation of the component, it can be advantageous to test the consumption conformance thereof, in particular since modern components operate with currents that are increasingly high under power supply voltages that are low. It is thus necessary to insert a current-measuring program into the test program proper.

This function is performed by the measurement sequencer 250 which includes a measurement sequence 251 delivered by the testing circuit 220, after being initially compiled by the operator on the computer 100, at the same time as the test sequence 231.

Figure 2:
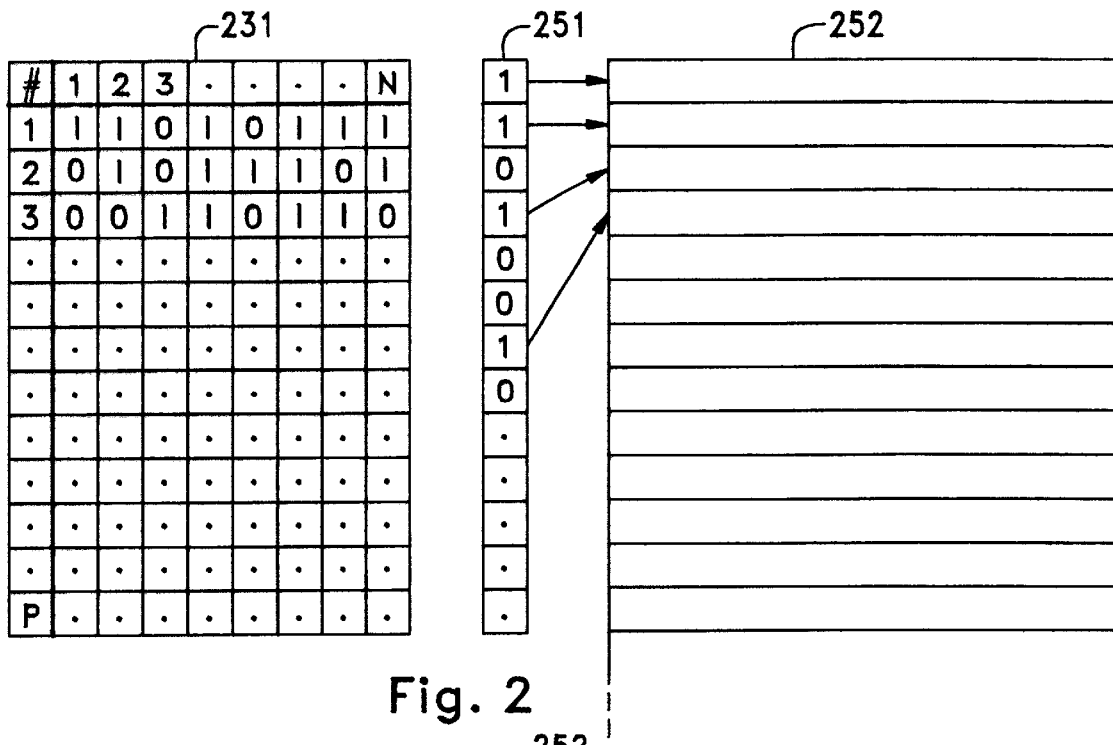
FIG. 2 is a diagram showing the configuration between the test sequence, the measurement sequence, and the multiple acquisition memory of the apparatus of the invention.

The structure of the measurement sequence 251 is shown in FIG. 2. It can be seen that each measurement row corresponds to a row of the test sequencer 231 and it comprises a measurement flag representative of a command to perform or not to perform a current measurement. For example, said measurement flag may be 1 if a current measurement is to be performed, and 0 if a current measurement is not to be performed. Thus, in the example shown in FIG. 2, it can be seen that at the same time as the logic signals of the first test row are applied to the N pins of the component, a current measurement must be performed, as must a current measurement on the following row. In contrast, in the logic configuration of the third test row, no current measurement is specified.

Figure 3:
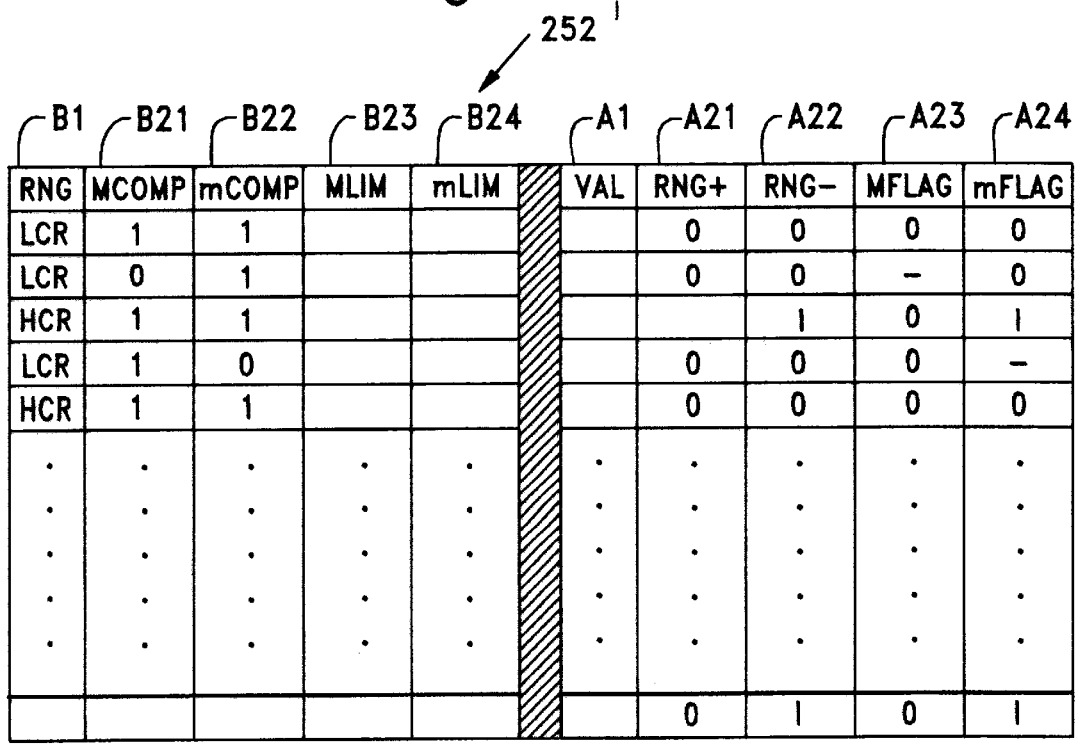
FIG. 3 is a diagram showing the structure of the multiple acquisition memory shown in FIG. 2.

As indicated in FIG. 1, the measurement sequencer 250 also includes a multiple acquisition memory (MAM) whose structure, shown in FIGS. 2 and 3, is constituted by a plurality of, e.g. 2,048, acquisition rows, each of which corresponds to a measurement row of the measurement sequencer 251 whose flag is positive, i.e. equal to 1 in this example. In other words, the multiple acquisition memory 252 is addressed only when a command to perform a current measurement is given by the measurement sequence 251.

More precisely, FIG. 3 shows that the multiple acquisition memory 252 includes two types of zones, namely zones referenced with the prefix B which correspond to flags or values predefined, acquisition row by acquisition row, by the operator at the same time as the operator prepares the test sequences and the measurement sequences. The zones referenced with the prefix A are also flags or values which, unlike the B zones, are defined acquisition row after acquisition row as the measurement sequence 251 progresses.

Among the B zones the following may be noted:

A range zone B1 in which a range flag RNG is written indicating the measurement range selected between a high-current range HCR and a low-current range LCR, naturally provided that the current-measuring means are suitable for delivering the value of the current measured in a plurality of current ranges. It is thus possible for the operator to choose the measurement range that is appropriate for obtaining the best sensitivity given the expected current value.

An upper limit zone B23 in which an upper limit value MLIM of the current taken by the electronic component 10 is written, and a lower limit zone B24 in which a lower limit value mLIM of the current taken is written. Testing consumption conformance is performed by comparing the measured current value with at least one of the two limit values.

Zone B21 is an upper comparison zone in which an upper comparison flag MCOMP is written representative of a command to perform comparison with the upper limit MLIM. This flag may be of logic value 1 for the command to perform said comparison or of logic value 0 for the command not to perform said comparison. The same applies to the lower comparison zone B22 with the flag mCOMP.

The A zones are as follows:

Zone A1 in which, each time a measurement is taken, the value VAL of the current as measured is written, which value is compared with the limit values mLIM and MLIM. This zone A1 is optional insofar as conformance testing of the consumption of the component lies, in fact in the results of the above-mentioned comparisons, and not in the value of the current itself. However, knowing the current taken for each measurement row makes it possible to characterize the component exactly by reconstructing the way the current changes during operation.

Zones A21 and A22 are respectively a range overflow zone and a range underflow zone, in which zones respective flags RNG+ and RNG− indicating the value of the current as measured has overflowed or underflowed from the selected range RNG. The flags RNG+ and RNG− are 0 or 1 logic values. This flagging enables the operator to know whether the current has been measured in the correct sensitivity range.

Zones A23 and A24 which are conformance zones in which respective conformance flags MFLAG and mFLAG are written each time a measurement is performed, which flags are respectively representative of comparison performed in the register 253 between the measured current value and respectively the limit value MLIM and the limit value mLIM. Here too said conformance flags are logic values, e.g. 0 if the compared values match or 1 if they do not. Naturally, these flags are essential parameters for conformance testing of the consumption of the electronic component under test.

It can also be seen in FIG. 3 that the multiple acquisition memory 252 has a global status row GS including in particular an upper global conformance zone and a lower global conformance zone, which zones correspond respectively to zone A23 and to zone A24. Each of the global conformance zones contains a global conformance flag that is positive, i.e. equal to 0 in this example, if all of the flags in the corresponding zone A23, A24 are positive, or equal to 1, i.e. negative, if at least one of the flags in the zone in question is equal to 1. The global conformance flags are then computed by means of an OR gate.

Initially, the operator can rely merely on the global conformance result to accept or reject the component 10. But when there is global non-conformance, the operator can, by referring to the flags contained in the memory 252 in each measurement row, detect that moment in the test sequence at which an anomaly occurred, and thus find the cause of the anomaly.

The diagram shown in FIG. 4 explains how the sensitivity range can be changed during a sequence.

The power supply circuit 242 includes two current measurement outputs. Output 241 is an analog-to-digital converter in which the value of the current as measured in the high sensitivity range HCR is stored in digital form, while the output 242 is an analog-to-digital converter in which the value of the current as measured in the low sensitivity range LCR is stored, also in digital form. The two outputs 241 and 242 are connected to the comparison register 253 via a switching member, symbolically represented by the switch 243, so as to deliver to the register either the value coming from the output 241 or the value coming from the output 242, the choice being forced on said switching member by the flag RNG whose HCR and LCR values are written in zone B1 of the multiple acquisition memory 252.

We claim:

1. Conformance testing apparatus for testing the consumption of an electronic component (10) in a testing machine, the apparatus including:
   at least one electrical power supply circuit (240) for powering the component (10), which circuit includes current-measuring means for measuring the current taken by said electronic component (10);
   a test sequencer (230) suitable for executing a sequence (231) of test rows to be applied to the component (10); and
   a current measurement sequencer (250) suitable for executing a sequence (251) of measurement rows, each of which corresponds to a test row, and contains a measurement flag defined prior to execution of the test sequence (231) and representative of a command to perform or not to perform a current measurement;
   said apparatus being characterized in that said measurement sequencer (250) includes a multiple acquisition memory (252) having a plurality of acquisition rows, each of which corresponds to a measurement row of the measurement sequence (251) whose measurement flag is positive, said memory (252) including for each acquisition row:
   at least one limit value zone (B23, B24) in which a limit value (MLIM, mLIM) for the current taken by the electronic component (10) is written prior to execution of the test sequence (231); and
   at least one conformance zone (A23, A24) in which, for each measurement, a conformance flag (MFLAG, mFLAG) is written representative of the result of a comparison performed in a register (253) associated with said memory (252) between the current as measured and said limit value (MLIM, mLIM).

2. Apparatus according to claim 1, characterized in that said multiple acquisition memory (252) further includes a global status row (GS) including a global conformance zone corresponding to said conformance zone (A23, A24), and in which a global conformance flag is written after the test sequence (231) has been executed, the global conformance flag being positive if all of the conformance flags are positive, or negative if at least one conformance flag is negative.

3. Apparatus according to claim 1, characterized in that, for each acquisition row, the multiple acquisition memory (252) includes firstly a lower limit value zone (B24) for a lower limit value (mLIM) and an upper limit value zone (B23) for an upper limit value (MLIM), and secondly a lower limit value conformance zone (A24) indicating the results of comparison with the lower limit value (mLIM), and an upper limit value conformance zone (A23) indicating the results of comparison with the upper limit value (MLIM).

4. Apparatus according to claim 2, characterized in that said global status row (GS) includes a lower global conformance zone and an upper global conformance zone.

5. Apparatus according to any one of claim 1, characterized in that, for each acquisition row, said multiple acquisition memory (252) includes a lower comparison zone (B22) and an upper comparison zone (B21), in which zones, prior to execution of the test sequence (231), a lower comparison flag (mCOMP) and an upper comparison flag (MCOMP) are respectively written, which flags are representative respectively of a command to perform comparison with a lower limit value (mLIM) and of a command to perform comparison with an upper limit value (MLIM).

6. Apparatus according to any one of claim 1, characterized in that, for each acquisition row, said multiple acquisition memory (252) includes a measurement zone (A1) in which the value (VAL) of the current as measured is written for each measurement.

7. A apparatus according to any one of claim 1, characterized in that, with said means of measuring the current taken by the component (10) being suitable for delivering a current value in a plurality of measurement ranges, the multiple acquisition memory (252) includes a range zone (B1) for each acquisition row, in which zone a range flag (RNG) indicating the selected measurement range (HCR, LCR) is written prior to execution of the test sequence (231).

8. Apparatus according to claim 7, characterized in that said multiple acquisition memory (252) includes a range overflow zone (A21) and a range underflow zone (A22), in which zones an overflow flag (RNG+) and an underflow flag (RNG−) are respectively written during measurement, indicating that the measured current has overflowed or underflowed relative to the selected range.

* * * * *